United States Patent
Venkataramani et al.

[11] Patent Number: 5,902,647
[45] Date of Patent: May 11, 1999

[54] METHOD FOR PROTECTING PASSAGE HOLES IN A METAL-BASED SUBSTRATE FROM BECOMING OBSTRUCTED, AND RELATED COMPOSITIONS

[75] Inventors: Venkat Subramaniam Venkataramani, Clifton Park; James Anthony Brewer, Scotia; Marcus Preston Borom, Niskayuna, all of N.Y.; Wayne Charles Hasz, Pownal, Vt.; Lawrence Edward Szala, Scotia, N.Y.

[73] Assignee: General Electric Company, Schenectady, N.Y.

[21] Appl. No.: 08/758,328

[22] Filed: Dec. 3, 1996

[51] Int. Cl.$^6$ ................................. B05D 1/02; B05D 1/32
[52] U.S. Cl. ..................... 427/454; 427/142; 427/156; 427/282; 427/287
[58] Field of Search ...................... 427/142, 156, 427/282, 287, 259, 421, 250, 576, 585, 454, 352

[56] References Cited

U.S. PATENT DOCUMENTS

| | | | |
|---|---|---|---|
| 3,380,863 | 4/1968 | Silberberg et al. | 152/12 |
| 5,304,331 | 4/1994 | Leonard et al. | 264/141 |
| 5,441,767 | 8/1995 | DeSaulniers | 427/252 |

FOREIGN PATENT DOCUMENTS 5 107 40 B1   3/1992   European Pat. Off. .

Primary Examiner—Shrive Beck
Assistant Examiner—Fred J. Parker
Attorney, Agent, or Firm—Noreen C. Johnson; Douglas E. Stoner

[57] ABSTRACT

A method for temporarily protecting at least one passage hole in a metal-based substrate from being obstructed by at least one coating applied over the substrate is disclosed. The method includes the following steps:

(a) filling and covering the hole with a curable masking material which forms a protrusion over the hole;

(b) curing the masking material;

(c) applying at least one coating over the substrate and the masking material, wherein the coating does not substantially adhere to the protrusion; and then (d) removing the masking material to uncover the passage hole.

Usually, there are an array of holes, and they serve as conduits for cooling gasses for an engine component. The curable masking material exhibits substantially non-Newtonian flow characteristics which make it especially suitable for forming protrusions of the proper size and shape on the coating-side of an engine part.

Another embodiment of this invention relates to a the curable masking material itself, and to articles which include such a material.

43 Claims, 1 Drawing Sheet

METHOD FOR PROTECTING PASSAGE HOLES IN A METAL-BASED SUBSTRATE FROM BECOMING OBSTRUCTED, AND RELATED COMPOSITIONS

TECHNICAL FIELD

This invention relates generally to coatings technology. More particularly, it concerns the use of protective coatings which contain open holes axially aligned with open holes in a substrate.

BACKGROUND OF THE INVENTION

Substrates which are fabricated in an industrial setting are usually subjected to a variety of processing steps. For example, metal substrates, after being cast, may undergo many procedures to achieve a final product, such as grinding, cold-working, cleaning, annealing, grit-blasting, further cleaning, and the like. There may be a variety of designed features on or in the substrate which are incorporated early on in processing, and which must be preserved through all subsequent fabrication steps.

Turbine engines provide a good illustration. The "substrate" may be a turbine blade, or may be a combustion chamber (combustor), for example. The parts are often made from high temperature metallic alloys, often referred to in the art as "superalloys". When turbines are used on aircraft, they are typically run at a temperature as high as possible, for maximum operating efficiency. Since high temperatures can damage the alloys used in the engine, a variety of approaches have been used to raise the operating temperature of the metal components. One approach calls for the incorporation of internal cooling channels in the component, through which cool air is forced during engine operation. Thus, the "designed feature" in this instance is a pattern of cooling holes which extend from one surface of the part to another. For example, the holes may extend from a cooler surface of a combustor to a "hot" surface which is exposed to combustion temperatures of at least about 1200 C. The cooling holes are usually formed in the substrate by specialized laser-drilling techniques. Cooling air (usually provided by the engine's compressor) is fed through the holes from the cooler side to the hot side of the combustor wall. As long as the holes remain clear, the rushing air will assist in lowering the temperature of the hot metal surface and preventing melting or other degradation of the component.

Another technique for protecting the metal parts and effectively raising the practical operating temperature of an aircraft engine involves the use of a thermal barrier coating (TBC). The TBC is usually ceramic-based. TBC systems frequently also include a bond coat which is placed between the ceramic coating and the substrate to improve adhesion. The use of TBC's in conjunction with the battery of cooling holes is sometimes the most effective means for protecting an engine part. However, incorporation of both systems can be very difficult. For example, the cooling holes sometimes cannot be formed in the engine part after a TBC has been applied, since lasers usually cannot effectively penetrate both the ceramic material and the metal to form the pattern of holes.

If the cooling holes are formed prior to the application of the TBC system, they may become covered and at least partially obstructed when the TBC is applied. Complete removal of the ceramic-metal material from the holes can be very time-consuming and ineffective, if not impossible. Any obstruction of the holes during engine operation can interfere with the passage of cooling air, can waste compressor power, and can possibly lead to engine component damage due to overheating.

Even if a type of laser could satisfactorily penetrate the TBC, registration and alignment difficulties would remain. For example, there would be no suitable technique for ensuring that the hole being drilled through the TBC is properly aligned with the hole previously drilled in the substrate itself.

From this discussion, one can readily understand that new methods for protecting certain features on metal substrates during subsequent processing steps would be welcome in industry. Of particular interest in the area of turbine engines would be new methods for providing open holes which communicate through various coating layers on engine parts.

These new methods should protect the designed features, but should also allow the particular features to become fully exposed after the other processing steps are complete. Furthermore, the techniques should also be useful for repairing TBC systems while retaining open holes axially aligned with previously-formed open holes in the substrate.

Moreover, the techniques involved should be completely compatible with the other processing steps, and should not adversely affect the substrate. For example, the strength and integrity of a turbine engine part should be completely retained after the treatment to protect the cooling holes has been completed.

SUMMARY OF THE INVENTION

The needs discussed above have been met by the discoveries outlined herein. One embodiment of this invention is directed to a method for temporarily protecting at least one passage hole in a metal-based substrate from being obstructed by at least one coating applied over the substrate, comprising the following steps:

(a) covering the hole with a curable masking material which forms a protrusion over the hole;

(b) curing the masking material;

(c) applying at least one coating over the substrate and the masking material, wherein the coating does not substantially adhere to the protrusion; and then (d) removing the masking material to uncover the passage hole.

As discussed previously, the substrate often includes a row or an array of passage holes. They are frequently cooling holes within turbine engine components. The curable masking material exhibits substantially non-Newtonian flow characteristics which make it especially suitable for forming protrusions of the proper size and shape on the coating-side of an engine part. The material can be thermoplastic or thermosetting, and is usually used in an admixture with at least one filler or other rheology-modifying additive.

Another embodiment of this invention relates to the curable masking material itself, which comprises an extrudable resin composition which is thermally stable at elevated temperatures— usually up to a temperature of at least about 350 C. The material exhibits substantially non-Newtonian flow characteristics, e.g., those of a Bingham solid. It may be an epoxy or phenolic resin, for example, used in conjunction with at least one organic or inorganic filler like graphite or silica. When cured, the masking material ideally does not serve as an adhesion site for protective coatings which are subsequently applied. The masking material is easily removed from the substrate after any related processing operations have been completed.

Numerous other details regarding these and other embodiments of the present invention are provided below.

DETAILED DESCRIPTION OF THE INVENTION

Figure 1:
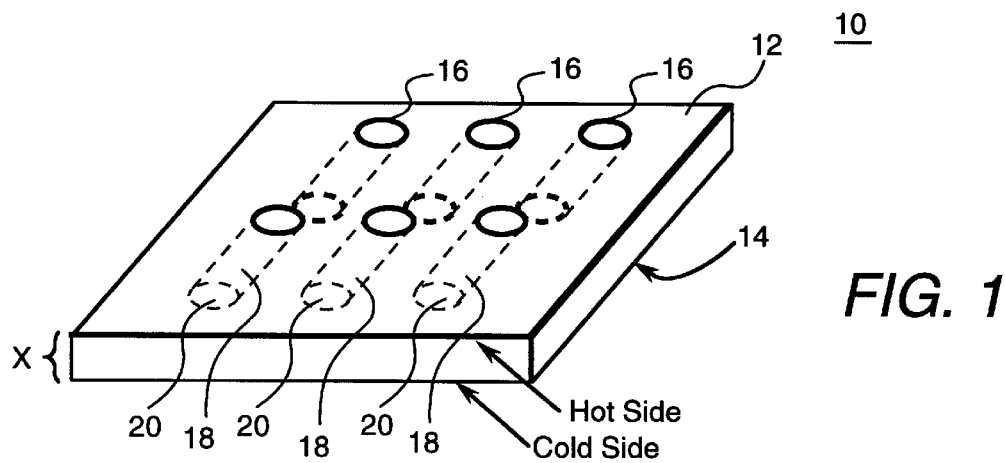
FIG. 1 is a schematic, isometric view of a typical substrate which contains holes or passageways.

The metal-based substrate can be any metallic material or alloy which is to be covered (at least in part) by some sort of coating. "Metal-based" refers to substrates which are primarily formed of metal or metal alloys, but which may also include some non-metallic components, e.g., ceramics or plastics. The holes which are in the substrate usually extend from one surface to another surface, and may constitute a variety of shapes. The surface to which at least one coating is subsequently applied is the "hot" surface (described above) when the substrate is a component of a turbine engine. The distance between the surfaces, which is usually equivalent to the thickness of the substrate, is usually in the range of about 10 mils to about 250 mils, and most often, in the range of about 20 mils to about 125 mils. Very often—especially when used as cooling passageways in some sort of engine part—most of the holes are substantially circular, thus having a cylindrical shape through the body of the substrate. The diameter of the holes often is in the range of about 5 mils to about 500 mils. In some embodiments, the diameter is in the range of about 5 mils to about 100 mils. The holes may be substantially perpendicular to the substrate surface, or they may be situated at an angle, e.g., at least about 10 degrees relative to a horizontal outer surface. This will of course depend on the function of the holes. When they are used as cooling passageways in an engine part, they are often situated at an angle in the range of about 20 degrees to about 80 degrees relative to the horizontal outer surface. Moreover, the depth of the hole for that type of end use (i.e., the "length" of a hole if it is situated at an angle) is usually in the range of about 50 mils to about 700 mils. There are usually about 50 to about 120 holes per square-inch of the substrate surface.

As mentioned above, the holes are initially filled and covered with a curable masking material (sometimes referred to herein as a "maskant"). The characteristics of the masking material—both in its uncured and cured states—are important to the operability of this invention. When the maskant is to be extruded through the hole, it should exhibit substantially non-Newtonian flow characteristics. In other words, the maskant should be able to flow easily through the holes only under the application of force, either by pressure or vacuum. The portion of the maskant material which leaves the hole and moves onto the surrounding surface no longer experiences a substantial shearing force, i.e., it is relatively free-standing, and resists "slumping". This "flow and freeze" characteristic results in the formation of the "bumps" or protrusions which cover each hole, as discussed below. The protrusions may increase slightly in size as more material exits the hole, but the general shape of the protrusions is retained.

There are several types of materials having non-Newtonian characteristics which are suitable for the present invention. The characteristics of these materials are well-known in the art of fluid mechanics and chemical engineering, and are described, for example, in *Ullmann's Encyclopedia of Industrial Chemistry*, Fifth Edition; Volume B2, VCH Publisher (1988), pp. 8–17 to 8–18; and Volume B1, pp. 5–25 to 5–28; in the *Kirk-Othmer Encyclopedia of Chemical Technology*, 3rd Edition, Vol. 10, p. 600–603 (1980.); and in U.S. Pat. No. 5,304,331 (W. Leonard et al), incorporated herein by reference. One class of maskant material is referred to as pseudoplastic or "shear-thinning". Here, the ratio of shear stress to shear rate (i.e., the viscosity) is a decreasing function of the shear rate, as described in Volume B1 of the Ullmann reference. These materials usually have a viscosity, at a given use-temperature, of about 1 centipoise to about 5000 centipoises, and preferably, in the range of about 10 centipoises to about 2000 centipoises.

Another class of suitable material which is particularly preferred for the present invention is referred to as a Bingham-solid material, which exhibits a "yield stress". In other words, the shear stress must exceed a certain value before the material begins to flow. The material may at that point begin to display a linear "rate-of-shear versus shear stress" behavior similar to that of a Newtonian system, as described in the Kirk-Othmer reference mentioned above. These materials usually have a viscosity, at a given use-temperature, of about 1 centipoise to about 15,000 centipoises, and preferably, in the range of about 10 centipoises to about 5000 centipoises. Bingham materials generally exhibit the "flow and freeze" characteristic which results in the formation of the discrete protrusions which cover the surface of each hole.

It should be emphasized that the maskant material useful for the present invention, while exhibiting substantially non-Newtonian behavior, may exhibit a small degree of Newtonian behavior. As an illustration, a material which exhibited absolute Bingham solid (non-Newtonian) characteristics might be expected to exit the hole and take the form of an inclined rod extending up from the surface (i.e., a geometry similar to the hole itself), rather than taking the shape of an elliptical dome. Thus, it should be understood that the preferred maskant material described herein should have a flow characteristic which is generally sufficient to form the protrusions described herein, with the purpose of the protrusions for this invention also being kept in mind.

There are other important requirements for the maskant. It should be thermally stable (i.e., not melting, degrading, or substantially softening) under the time and temperature conditions encountered during processing of the particular substrate. Thus, when the substrate is used in high-temperature applications, the maskant should be stable up to a transient temperature of at least about 500 C. during the time period when subsequent coatings are being applied—especially coatings which require elevated temperatures for deposition, such as TBC systems. "Transient" as used herein indicates that deposition temperatures for techniques such as plasma spray may vary somewhat, depending on the location of the heat source (e.g., the torch) relative to the surface being coated. Preferably, the maskant should be stable to a transient temperature of at least about 650 C. This is especially true when the substrate is a turbine engine part, such as a combustor liner, which may be coated with a bond layer at deposition temperatures of about 350 C., and may then be coated with a TBC at a transient temperature of up to about 600 C.

In preferred embodiments, the maskant, once cured to form the protrusions which cover the holes, has a particular surface characteristic which prevents substantial adherence of a subsequently-applied coating to its surface. (By the prevention of "substantial adherence", it is to be understood that very minor amounts of exposed maskant-protrusions might be covered by the applied coatings, e.g., less than about 5% of the surface area of the protrusions, but the protrusions are still generally free of any of the applied coating.) This characteristic is particularly significant when the substrate is a turbine engine part and the subsequently-applied coatings are bond coatings and/or TBC's, as described below. The exposed protrusions of maskant are relatively easy to remove (i.e., to "unplug" the holes in the substrate), in contrast to the situation in which the protrusions are covered by coatings—especially refractory coatings.

Moreover, the cured maskant should be relatively hard and abrasion-resistant, so that subsequent pre-treatment and coating steps do not degrade the protrusions and prematurely uncover any of the substrate holes. Examples of pre-treatment of the masked substrate prior to the application of coatings include etching with solvents or acidic solutions, and/or grit-blasting with abrasive media.

The cured maskant should also be easily removable from both the coatings and the substrate holes after it has performed its function, i.e., after further coatings have been applied to the substrate and fired or cured. As described below, the maskant can be removed by a variety of techniques, such as pyrolysis or dissolution with solvents. The techniques used should preferably result in a minimum of maskant-residue within the holes. For example, on average, less than about 5%, and preferably, less than about 1% of the total inner surface area of the holes should be covered by any residue.

Various polymer systems fulfill the requirements stated above, as those skilled in the polymer arts understand. Most of the systems include a resin and at least one filler. Thermosetting resins are preferred in some embodiments because of the fact that they are often heat resistant up to at least about 400 C., and they are usually quite hard and abrasion-resistant. Because they are not easily processible in their cured state, these materials are used for this invention in an uncured (non-cross-linked) or partially-cured state, based in part on the rheological requirements discussed above.

One example of a suitable thermosetting resin is an epoxy. Such materials are well-known in the art and described in many sources, such as *Organic Polymer Chemistry*, by K. J. Saunders, Chapman and Hall, 1973; and in *The Condensed Chemical Dictionary*, 10th Edition, 1981, Van Nostrand Reinhold Company. Many of these materials are liquid-epoxies, and are based on starting compounds such as bisphenol A ((2,2-bis(4'-hydroxyphenyl)propane)) and a co-reagent such as epichlorohydrin. As is known in the art, epoxies are often supplied as 2-component systems, e.g., a resin like bisphenol A-epichlorohydrin, and a curing agent such as a tertiary amine, a polyfunctional amine, or an acid anhydride. When the 2-component system is mixed (which can be accomplished in an extrusion system), the product quickly cross-links into a polymer which satisfies the needs of this invention. Those of skill in the art realize that various other epoxy resins could also be used herein, as long as they conform to substantially all of the parameters outlined above.

Phenolic resins are another type of preferred thermosetting polymers for the present invention. Many phenolics are heat resistant up to at least about 400 C. The chief class of phenolic resins are the phenol-formaldehyde materials, which are known in the art and described, for example, in the Saunders text mentioned above. Within this class of materials, "resoles" are prepared by reacting phenol with a molar excess of formaldehyde, under alkaline conditions, while "novolacs" are usually prepared by reacting a molar excess of phenol with formaldehyde, under acidic conditions. In general, polymerization is often carried out in two stages: (1) formation of a low molecular weight, soluble resin, and then (2) curing operations to covert the soluble resin to a cross-linked, high-molecular weight product. In the present invention, a phenolic material in the first stage can be extruded through the substrate holes as described below. When cured by conventional techniques in the second stage, i.e., after the protrusions have been formed, this type of maskant material is very hard and solvent-resistant, making it very tolerable of the potential pre-coating treatments mentioned above.

Various other types of thermosetting resins may be used as a maskant for the present invention, although they may vary in the degree to which they can be readily extruded through (or otherwise be made to cover) the substrate holes in their uncured or non-cross-linked state. One other example is a thermosetting polyester, which is usually a polycondensation product of a dicarboxylic acid with a dihydroxy alcohol. These resins can be cross-linked through their double bonds with compatible monomers to become thermosetting. Diols like propylene glycol are often used to prepare these types of polyesters, in conjunction with unsaturated acids or anhydrides like maleic anhydride. Alkyd resins, which are well-known in the art, are included within the broad definition of polyesters, and are also thought to be useful for the present invention.

Silicone resins which cross-link are also suitable maskant materials for some embodiments of the present invention. These materials are usually siloxane polymers based on a structure of alternating silicon and oxygen atoms with various organic radicals attached to the silicon. In preferred embodiments, the silicones should not be the type which convert to a high degree of silica when cured, since the silica may be a difficult residue to remove from the substrate holes.

As mentioned above, thermoplastic resins can also be very suitable as maskant materials for this invention. Some of the advantages of these materials are their ease-of-handling (once softened), and amenability to extrusion. Examples are the polyamide or "nylon" resins, which are described in many references, such as the Saunders text and U.S. Pat. No. 4,824,915 (Aycock et al), incorporated herein by reference. They are prepared by well-known methods, such as the reaction of a diamine and a dicarboxylic acid. Non-limiting, commercial examples of these materials are polyamide 6; 6/6; 11; 12; 6/10; and 6/12; and compatible mixtures thereof.

Thermoplastic polyesters such as polyethylene terephthalate (PET) and polybutylene terephthalate (PBT) (or mixtures or copolymers thereof) could also be used as the maskant material. These materials are well-known in the art and described in a variety of references. Their preparation is also well-known. For example, PET is usually prepared by an ester interchange reaction.

Polycarbonates, which are somewhat related to the thermoplastic polyesters, may also be used as the maskant material. These materials are also known in the art, and are available, for example, under the Lexan product designation of General Electric Company. They can be made by a variety of methods, e.g., the reaction of bisphenol A and phosgene; or a transesterification reaction involving diphenyl carbonate.

Polyimides could also be used, i.e., polymers having the imide group (—CONHCO—) in the polymer chain. A particular type of polyimide is referred to as a "polyetherimide", and is available from General Electric Company under the Ultem product designation.

A wide variety of thermoplastic acrylics could also be used for this invention, all of which are known in the art. Many are based on acrylic acid or methacrylic acid, or on esters of these compounds. Some are also based in part on acrylonitrile and/or acrylamide. Acrylic copolymers are included herein within the definition of "acrylics".

Those of skill in the polymer arts could certainly conceive of other polymers or polymer mixtures which may be suitable for the present invention, based on the parameters outlined herein. Non-limiting examples would include various styrene-based resins (e.g., polystyrene; rubber-modified polystyrene; acrylonitrile-butadiene-styrene (ABS)); polyphenylene ether; emulsion-type systems such as latex emulsions; polyurethanes; polyolefins; sulfur-containing polymers such as polyphenylene sulfide; and mixtures of any of these polymers with each other; with elastomers; or with any of the other materials mentioned herein.

As mentioned above, the polymer or polymer mixture will usually be used in conjunction with at least one additive which influences its rheological characteristics. (Thus, the maskant material is sometimes referred to herein as a polymer "system"). The additive is usually a filler, a reinforcing agent, or an extending agent. (For the purpose of this discussion, "filler" is meant to include reinforcing- and extending agents, as well as "thickening agents", although these other terms sometimes refer to different types of materials utilized for other purposes). Fillers are well-known in the art. In general, the weight-ratio of the base polymer or polymers to total rheological modifier is usually in the range of about 90:10 to about 50:50. Selection of a particular additive will depend on various factors, such as its ability to affect the viscosity of the polymer system; its compatibility with the base polymer or polymer mixtures; and the type and amount of residue attributable to the additive when the polymer system is removed from the substrate hole.

Organic fillers are often preferred for this invention. This is due in part to the fact that any residue resulting from their use is minimal, and can be easily removed with the rest of the maskant. Non-limiting examples of organic fillers are paraffins or other waxes; gums, cellulosic materials such as methylcellulose; wood, sawdust, walnut shell powder; or a rubber, such as isoprene. The rubber could be utilized in a form which would facilitate mixing with the base polymer, e.g., in the form of an emulsion. In some preferred embodiments, cellulosic materials would be the organic filler of choice.

A variety of inorganic fillers are also very suitable for use in some embodiments of this invention. Non-limiting examples include graphite, silica, alumina, magnesium oxide, talc, alkaline earth carbonates, zirconium basic carbonate, sulfates, sulfides, halides, phosphates, borates, borosilicates, slate flour, clay, and any combination of the foregoing. Graphite is often the most preferred inorganic filler. Fumed silica may also be preferred for some embodiments, if its residue can be adequately removed when the maskant is removed from the substrate holes.

Mixtures of organic and inorganic fillers may also be suitable for the present invention. As a non-limiting example, a mixture of rubber with silica, or a mixture of a cellulosic material with silica, in a weight ratio (in each instance) ranging from about 90:10 to about 10:90, may be appropriate in some circumstances. Separate mixtures of either organics or inorganics are also possible, e.g., a mixture of graphite and silica in the case of inorganics.

As alluded to earlier, the total amount of filler used will be determined in large part by the desired rheological nature for the polymer system being used as a maskant. The level of filler should thus be that which provides the polymer system with a substantially non-Newtonian flow characteristic. In preferred embodiments, the level is such that the polymer system has a shear-thinning flow characteristic. In especially preferred embodiments, the polymer system has a Bingham solid characteristic, as described above. These flow characteristics are stated here in terms of the use-temperature of the polymer system, i.e., the temperature at which it is delivered to the substrate holes, via extrusion or some other process. For thermoset-based polymer systems, this may typically be room temperature, whereas for thermoplastic-based systems, this may be the softening point or melting point of the polymer.

However, the level of filler should not be so high as to cause adherence of subsequently-applied coatings to the protrusions formed when the polymer system is cured. (Excessive amounts of some fillers are thought to cause this undesirable adhesion). In general, the level of total filler will be in the range of about 1% by weight to about 50% by weight, based on the weight of the polymer system. In preferred embodiments, the level of total filler will be in the range of about 5% by weight to about 20% by weight. Those of ordinary skill in the art will be able to select the most appropriate type and level of filler, based on this teaching and related experimentation.

A variety of other additives may be used in the polymer system. Most of them are well-known in areas of chemical processing. As but one illustration, many are described in the Kirk-Othmer *Encyclopedia of Chemical Technology*, 4th Edition, Vol. 5, pp. 610–613. Non-limiting examples include binders, plasticizers, emollients, lubricants, and surface tension-modifiers.

Still another additive which may be suitable is a liquid crystal polymer or oligomer. Liquid crystal materials are usually organic and fall into one of three classes: smectic, nematic, or cholesteric. Special mention is made of these materials because many of them exist in a transition state between solid and liquid forms. They may therefore prove to be advantageous in adjusting the rheological nature of the maskant.

The choice of a particular additive will obviously depend on the needs of a given polymeric system, as well as other factors, e.g., the type and level of residue the additive might leave when the maskant is removed from the substrate holes. Usually, these additives are used at a level of less than about 5% by weight of the total polymer system.

Figure 2:
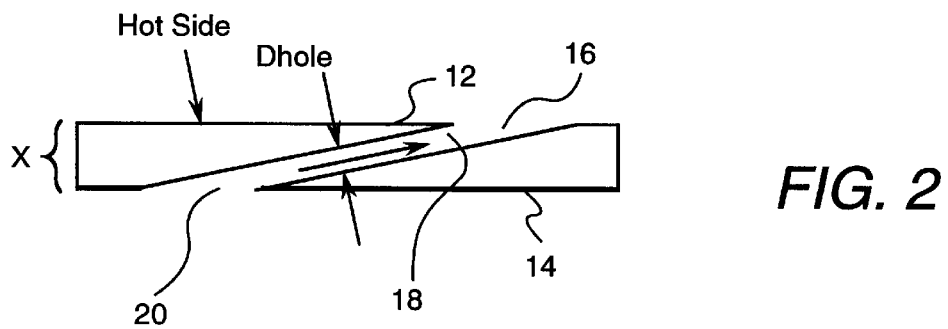
FIG. 2 is a cross-sectional view of a portion of a substrate similar to that of FIG. 1.

As described previously, substrates related to the present invention often contain a multitude of passage holes. An exemplary substrate 10 is depicted in FIG. 1. It has a first surface 12, over which at least one coating is subsequently applied, and a second surface 14. Passage holes 16 extend throughout hole length section 18 to exit through hole bottom 20. The substrate thickness (designated by dimension "x") is usually in the range of about 10 mils to about 250 mils, and most often, in the range of about 20 mils to about 125 mils. As further depicted in FIG. 2, the holes are often inclined relative to the first surface, e.g., in the case of a turbine engine component which contains cooling holes. Other details regarding the passage holes have already been discussed.

The holes can be filled and covered with the maskant by a variety of techniques. However, in preferred embodiments, the holes are covered by way of an extrusion technique. In one specific embodiment, the maskant is extruded into each hole 16 from first surface 14, through hole length 18, exiting each hole at second surface 12.

Extrusion is a well-known, fundamental technique for the processing of polymers. It is described, for example, in the Kirk-Othmer treatise mentioned above. In general, it involves the forging of the material of choice through a metal-forming die, followed by cooling or chemical hardening (i.e., curing). Higher viscosity materials are fed into a rotating screw of variable pitch, which forces the material through the die with considerable pressure. Many different types of extrusion equipment are commercially available. An exemplary extrusion apparatus and method for Bingham solid-type materials is provided in the Leonard et al patent referenced above.

In the present instance, the "die" can be the substrate itself, which contains the holes through which the maskant is extruded. Existing extrusion equipment can be readily modified without undue effort, so that the exit-end of the screw terminates at or near the inner surface of the substrate. Conventional extruders have one or more entry points, e.g., "hoppers", which can accommodate maskant materials or maskant precursor materials in liquid or solid form. The extruders also have standard heating mechanisms (e.g., heating bands), so that the maskant material can be brought to the appropriate extrusion temperature.

As those of ordinary skill in the molding arts understand, the rheological characteristics required for this invention and for a processing operation like extrusion, in general, depend on many factors, such as viscosity, temperature, flow rate, and die design. All of these parameters can be adjusted for the present invention, by way of equipment control, atmospheric control, and masking material-composition. As an illustration, the pressure used for extrusion of the maskant through a hole having an average length of about 50 mils to about 700 mils and an average hole diameter of about 5 mils to about 500 mils is usually in the range of about 1 psi to about 30 psi.

The pressure can be applied from a source other than the extruder itself. For example, after a layer of maskant is spread on the first surface of the substrate, covering the hole entrances, a pressure differential could be formed between the first surface and the second surface by conventional techniques, extruding the maskant through each hole.

In some embodiments, it may be desirable to spread a thin (e.g., about 0.5 mil to about 100 mils) sheet of material over the curable masking material after the maskant has been applied over the first surface of the substrate. The sheet can be made of a material which would not adhere to the maskant, e.g., a saran- or rubber-type sheet in the case of many of the maskant materials listed above. This sheet would help to prevent the "blow-through" of the maskant completely through one or more of the holes.

The maskant is then cured by conventional means. Those of skill in the polymer arts understand that thermosetting materials are usually cured by the action of a catalyst and/or the use of high temperatures. Thermoplastic materials such as polyamide or PET, which are initially heated for extrusion or other processing steps, will cool down quickly after processing to harden into final form. Thus, "curing" as used herein refers to any type of steps which put the maskant material into final form. When needed, heat can be applied to a polymer or polymer precursor by conventional techniques, e.g., a convection oven, heat lamp, etc.

Figure 3:
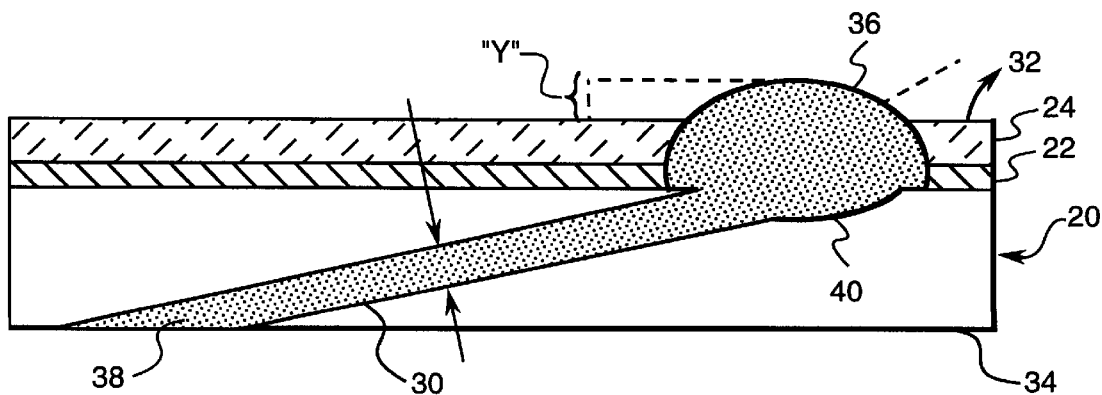
FIG. 3 is another cross-sectional view of a portion of a substrate similar to that of FIG. 1, wherein the featured hole has been filled and covered with a maskant material.

FIG. 3 is a cross-sectional view illustrating a cured maskant 40 filling up and covering a hole 30 which extends through substrate 20, which includes coating layers 22 and 24 (discussed below). The maskant material in this particular embodiment was extruded through the hole from the hole entrance 38 on first surface 34, exiting the hole at second surface 32, and forming protrusion 36, which is hemispherical in shape. As described above, the special rheological characteristics of the maskant allowed the formation of the protrusion as soon as the extrusion pressure was terminated.

In preferred embodiments, the height of the protrusion, illustrated in FIG. 3 by dimension "y", is at least about 50% greater than the expected, total thickness of coatings to be applied (and cured or fired) on the substrate. In especially preferred embodiments, the height of the protrusion is at least about 100% greater than the expected coating thickness. For the situation in which the substrate is a superalloy covered by a bond coat and a TBC of typical thickness, the height of the protrusion is usually in the range of about 20 mils to about 100 mils. The height of the protrusion is pre-selected in part by the amount of maskant which would be most appropriate for retaining the hole geometry and keeping the holes covered during any of the subsequent processing steps. As an example, if subsequent coating steps involved a considerable amount of grit blasting in preparation, larger protrusions (within the general ranges stated above) might be appropriate, to ensure that hole protection and hole geometry is maintained, despite any erosion.

As mentioned previously, the coatings applied to turbine engine substrates are usually TBC's and intervening bond layers. The compositions and techniques for forming these layers are well-known in the art. The bond layer, which is often very important for improving the adhesion between the metal substrate and the TBC, is usually formed from a material like "MCrAlY", where "M" represents a metal like iron, nickel, or cobalt. Very often, the bond coating may be applied by a variety of conventional techniques, such as PVD, plasma spray (e.g., air plasma), CVD, or combinations of plasma spray and CVD techniques. The TBC itself can be applied by a variety of techniques, such as plasma spray or electron beam physical vapor deposition (EB-PVD). Usually, the bond coat has a thickness in the range of about 1 mil to about 10 mils, and preferably, in the range of about 3 mils to about 7 mils. Typically, the TBC has a thickness in the range of about 5 mils to about 100 mils, and preferably, in the range of about 10 mils to about 40 mils.

Details regarding various techniques for applying the bond coat and the TBC can be found, for example, in Kirk-Othmer's *Encyclopedia of Chemical Technology*, 3rd Edition, Vol. 15, (1981) and Vol. 20 (1982); in *Ullmann's Encyclopedia of Industrial Chemistry*, Fifth Edition; Volume A6, VCH Publisher (1986); in *Scientific American*, H. Herman, Sep. 1988; and in U.S. Pat. No. 5,384,200, incorporated herein by reference. Thus, one of ordinary skill in the art can easily become familiar with various process details which may be relevant, e.g., cleaning of the surface prior to deposition; grit blasting (or some other form of abrasion) to remove oxides and roughen the surface; substrate temperature; and plasma spray parameters (when employed), such as spray distances (gun-to-substrate); selection of the number of spray-passes; powder feed rate, torch power, plasma gas selection; angle of deposition; post-treatment of the applied coating (e.g., deburring); and the like.

As mentioned previously, the subsequently-applied coatings, e.g., both the bond coating and the TBC, do not significantly adhere to the protrusions formed of cured maskant. This characteristic is particularly advantageous, since the exposed protrusions and the underlying remainder of maskant are relatively easy to remove. Many of the maskant materials can be efficiently removed by a pyrolytic technique. As an example, thermosetting materials like epoxies and phenolics can be "burned out" of the hole and surrounding substrate surface area at temperatures in the range of about 300 C. to about 900 C. The most appropriate temperature can be predetermined by reference to the thermal characteristics of the particular resin or resins which constitute the polymer system for the maskant. The heating temperature for the burn-out can be supplied via any conventional technique, such as an oven or any type of torch. The time required may vary, but is usually in the range of about 20 minutes to about 300 minutes, and more often, in the range of about 30 minutes to about 180 minutes. The heating technique should be one which will not damage the substrate or any of the coatings applied thereon. After pyrolysis is complete, any residue remaining in or around the holes can be removed by various techniques, such as agitation, alone or in combination with brushing techniques or gas-blasts (e.g., air).

It may not be necessary to pyrolyze a thermoplastic material used as the maskant, since such a material may simply flow out of the hole when the material is heated to a temperature at or around its melting point. Burning or one of the techniques mentioned below could then be used to more thoroughly clean the hole of the maskant.

As mentioned above, other techniques, in combination with each other or with pyrolysis, can sometimes be used to remove the protrusions and the underlying maskant. As an example, a solvent or solvent mixture (sometimes heated) which dissolves or solubilizes the maskant material could be applied to the substrate, or the substrate could be dipped in the solvent. To illustrate, polyamide-based maskants can usually be dissolved in hot phenols, or in cresols or formic acids, while phenolics could be dissolved in a hot caustic solution. The solvent or solvent mixtures should be those which do not adversely affect the substrate or the overlying coatings.

The holes in the substrate at this stage are free of any obstruction, and are therefore capable of performing their function, e.g., serving as the passageway for cooling air. Meanwhile, the substrate has also been provided with one or more coatings which also perform a specific function, e.g., acting as a thermal barrier in a high-heat environment. Thus, another aspect of this invention is directed to the curable masking material itself, which comprises an extrudable resin composition which is thermally stable up to a temperature of at least about 350 C. The material exhibits non-Newtonian characteristics, as discussed above. When cured, the masking material ideally does not serve as an adhesion site for protective coatings which are subsequently applied. The masking material is also easily removed from the substrate after any related processing operations have been completed, e.g., after the deposition of a bond coat and a TBC.

Yet another aspect of the present invention is directed to an article which comprises (I) a substrate which includes at least one passage hole extending from a first surface to a second surface;

(II) a curable masking material which fills the passage hole and covers the hole to form a protrusion over the hole; and (III) at least one coating applied over the second surface of the substrate, wherein the coating does not substantially adhere to the protrusion.

Details regarding the article can be found in the remainder of the teachings herein. In use, the article is further treated to remove the curable masking material and re-open the passage holes, as described previously.

Still another embodiment of the present invention relates to a method for repairing a damaged thermal barrier coating applied over a substrate which includes at least one passage hole extending from a first surface to a second surface on which the thermal barrier coating had been applied, comprising the following steps:

(A) removing the damaged thermal barrier coating from the second surface, uncovering any passage hole in the substrate;

(B) filling and covering the hole with a curable masking material which forms a protrusion over the hole;

(C) curing the masking material;

(D) applying additional thermal barrier coating material over the substrate and the masking material, wherein the coating does not substantially adhere to the protrusion; and then (E) removing the masking material to uncover the passage hole.

The repaired TBC has the advantageous properties described above.

The following example is not meant to limit the scope of the claimed invention. It merely illustrates an embodiment of the invention.

EXAMPLE

A two-component, commercial epoxy resin system (Epotek 730) was used in this example. The material was combined with 2% (by weight) of a silica material from Cabot Corporation; Cab-O-Sil M-5. The resulting mixture was then extruded through 0.020 inch-diameter cooling air holes from the underside of several substrate-sections (each approximately 4 inch ×4 inch, with a thickness of 62.5 mils) of a turbine engine combustor liner. The cooling air holes were inclined at an angle of about 20 degrees relative to the upper surface of the substrate sections. Uniaxial pressure was applied at a pressure level of about 2 to 5 psi, to cause the resin to fill the holes and protrude on the upper-side, i.e., the surface to be coated. The protrusions had an average height of approximately 40 mils. They were in the general shape of elliptical domes, and covered the hole openings.

The epoxy material was then cured at about 100 C. for 3 hours in a convection oven. The substrate-sections were then grit-blasted to prepare the surface for coating. A standard "NiCrAlY" bond coat was then applied to the substrate by air plasma spray, to a thickness of 0.005 inch, at a deposition surface temperature of about 200 C. A standard, yttria-stabilized zirconia thermal barrier coating was then applied by air plasma spray, at a deposition surface temperature of about 300 C. The TBC had a thickness of about 0.010 inch. Neither the bond coating nor the TBC adhered to the protrusions.

The epoxy material was then pyrolyzed at 600 C. for about 60 minutes in a forced-air convection oven, and the residue from the pyrolysis was cleaned from the holes by brushing and shaking.

Measurement of air flow through the substrate-section holes had been taken prior to any treatment. Those measurements were compared with those taken after the masking, coating, and pyrolysis/cleaning steps were carried out. The results demonstrate that (1) there was no reduction in the quantity of air; and (2) there was no adverse change in the flow pattern of the cooling air through the holes.

While preferred embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

All of the patents, articles, and texts mentioned above are incorporated herein by reference.

What is claimed:

1. A method for temporarily protecting a passage hole in a metal-based substrate from being obstructed by a coating applied over the substrate, wherein the substrate has a first surface and a second surface opposite the first surface, comprising the following steps:
    (a) filling and covering the passage hole with a curable masking material which exhibits a substantially non-Newtonian flow characteristic, forming a protrusion over the passage hole and above the second surface;
    (b) curing the masking material;
    (c) applying a coating over the second surface and the masking material, wherein the coating does not substantially adhere to the protrusion; and then
    (d) removing the masking material to uncover the passage hole;
    wherein the protrusion formed in step (a) has an average height above the second surface of the substrate which is at least about 50% greater than the thickness of the coating applied in step (c).

2. The method of claim 1, wherein the passage hole is filled and covered by an extrusion technique.

3. The method of claim 1, wherein the masking material is extruded from the first surface, through the length of the passage hole, to extend beyond the second surface.

4. The method of claim 3, wherein the extrusion is carried out by applying a layer of the masking material over the first surface, and then forming a pressure differential between the first surface and the second surface, causing the material to move to the second surface.

5. The method of claim 3, wherein the masking material is extruded under a pressure of about 1 psi to about 30 psi.

6. The method of claim 3, wherein a sheet of material is placed over the first surface after the masking material has been applied to the first surface, prior to the extrusion, and wherein the extrusion is then carried out by applying pressure on the sheet of material.

7. The method of claim 6, wherein the sheet of material comprises a rubber or a saran material.

8. The method of claim 1, wherein the curable masking material exhibits a Bingham solid characteristic.

9. The method of claim 1, wherein the curable masking material comprises a thermosetting resin and at least one additive selected from the group consisting of fillers, plasticizers, and liquid crystal materials.

10. The method of claim 9, wherein the thermosetting resin is selected from the group consisting of epoxy resins and alkyd resins.

11. The method of claim 10, wherein the epoxy resin is derived from bisphenol A.

12. The method of claim 9, wherein the thermosetting resin is a phenolic.

13. The method of claim 12, wherein the phenolic is a phenol-formaldehyde polymer.

14. The method of claim 9, wherein the filler is an organic material or a mixture of an organic material and an inorganic material.

15. The method of claim 14, wherein the organic material comprises a substance selected from the group consisting of rubber, wax, gums, cellulosic materials, wood, sawdust, walnut shell powder, and any combination of the foregoing.

16. The method of claim 9, wherein the filler comprises an inorganic material.

17. The method of claim 16, wherein the inorganic material is selected from the group consisting of graphite, silica, alumina, magnesium oxide, talc, alkaline earth carbonates, zirconium basic carbonate, sulfates, sulfides, halides, phosphates, borates, borosilicates, slate flour, clay, and any combination of the foregoing.

18. The method of claim 8, wherein the curable masking material comprises a thermoplastic resin and at least one additive selected from the group consisting of fillers, plasticizers, and liquid crystal materials.

19. The method of claim 20, wherein the thermoplastic resin is selected from the group consisting of acrylic resins, thermoplastic polyesters, polyamides, thermoplastic polyimides, polycarbonates, polyphenylene ethers, polyolefins, styrene-based resins, copolymers of any of the foregoing; and mixtures of any of the foregoing.

20. The method of claim 19, wherein the filler is an organic material or a mixture of an organic material and an inorganic material.

21. The method of claim 1, wherein the masking material is removed in step (d) by a technique which comprises pyrolysis.

22. The method of claim 1, wherein the masking material is substantially removed in step (d) by treatment with a solvent which dissolves the masking material.

23. The method of claim 1, wherein the metal-based substrate is a superalloy.

24. The method of claim 1, wherein the metal-based substrate is a component of a gas turbine engine.

25. The method of claim 24, wherein the component is a combustion chamber.

26. The method of claim 1, wherein the coating applied in step (c) comprises a thermal barrier coating.

27. The method of claim 1, wherein the substrate contains an array or row of passage holes, each temporarily protected according to steps (a) through (d).

28. The method of claim 1, wherein the second surface is a hot surface exposed to elevated temperature, and the first surface is a cold surface exposed to a temperature less than that to which the hot surface is exposed.

29. The method of claim 28, wherein the hot surface is exposed to a temperature of at least about 1200 C.

30. The method of claim 28, wherein the passage hole is a cooling hole.

31. The method of claim 1, wherein more than one coating is applied over the second surface of the substrate, in step (c).

32. The method of claim 31, wherein step (c) comprises applying a bond coat and then a thermal barrier coating over the bond coat.

33. A method for applying a thermal barrier coating to a surface of a high-temperature alloy substrate which includes cooling holes, wherein the cooling holes remain clear after the thermal barrier coating has been applied, comprising the following steps:
    (i) filling and covering the cooling holes with a curable masking material which forms a protrusion on the surface to which the thermal barrier coating is to be applied, over each cooling hole;
    (ii) curing the masking material;
    (iii) applying a thermal barrier coating over the exposed masking material, wherein the thermal barrier coating does not substantially adhere to the protrusions; and then (iv) removing the masking material to uncover the cooling holes.

34. The method of claim 33, wherein a bond coating is applied between steps (ii) and (iii), and the bond coating also does not substantially adhere to the protrusions.

35. The method of claim 33, wherein the holes are filled and covered by an extrusion technique.

36. The method of claim 33, wherein the curable masking material exhibits a substantially non-Newtonian flow characteristic.

37. The method of claim 34, wherein the average height of the protrusion above the substrate is at least about 50% greater than the expected, total thickness of the bond coating and the thermal barrier coating.

38. The method of claim 33, wherein the substrate is subjected to an adhesion-enhancing pre-treatment between step (ii) and step (iii).

39. The method of claim 33, wherein the pre-treatment comprises abrasion of the substrate surface.

40. The method of claim 34, wherein the bond coating and the thermal barrier coating are each applied by a plasma technique or by electron beam-chemical vapor deposition.

41. The method of claim 33, wherein the masking material is removed in step (iv) by a technique which comprises pyrolysis.

42. A method for repairing a damaged thermal barrier coating applied over a substrate which includes a passage hole extending from a first surface to a second surface on which the thermal barrier coating had been applied, comprising the following steps:

(A) removing the damaged thermal barrier coating from the second surface, uncovering the passage hole in the substrate;

(B) filling and covering the passage hole with a curable masking material which forms a protrusion over the passage hole;

(C) curing the masking material;

(D) applying additional thermal barrier coating material over the substrate and the masking material, wherein the coating does not substantially adhere to the protrusion; and then (E) removing the masking material to uncover the passage hole.

43. The method of claim 42, wherein the substrate contains more than one passage hole.

* * * * *